(12) United States Patent
Maier et al.

(10) Patent No.: US 9,988,262 B2
(45) Date of Patent: Jun. 5, 2018

(54) TEMPORARY MECHANICAL STABILIZATION OF SEMICONDUCTOR CAVITIES

(71) Applicant: Infineon Technologies AG, Neubiberg (DE)

(72) Inventors: Dominic Maier, Pleystein (DE); Joachim Mahler, Regensburg (DE); Daniel Porwol, Straubing (DE); Alfred Sigl, Sinzing (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/704,537

(22) Filed: Sep. 14, 2017

(65) Prior Publication Data
US 2018/0086632 A1 Mar. 29, 2018

(30) Foreign Application Priority Data
Sep. 23, 2016 (DE) .................. 10 2016 117 990

(51) Int. Cl.
*B81C 1/00* (2006.01)

(52) U.S. Cl.
CPC ...... *B81C 1/00047* (2013.01); *B81C 1/00666* (2013.01); *B81C 2201/013* (2013.01); *B81C 2201/0125* (2013.01); *B81C 2203/0118* (2013.01); *B81C 2203/0127* (2013.01)

(58) Field of Classification Search
CPC ............ B81C 1/00047; B81C 1/00666; B81C 2203/0118; B81C 2201/013; B81C 2203/0127; B81C 2201/0125
See application file for complete search history.

(56) References Cited

U.S. PATENT DOCUMENTS

| 5,074,629 | A | 12/1991 | Zdeblick |
| 6,346,433 | B1 | 2/2002 | Maeda et al. |
| 6,956,283 | B1 | 10/2005 | Peterson |
| 9,556,022 | B2 | 1/2017 | Pahl |
| 2005/0250253 | A1 | 11/2005 | Cheung |
| 2016/0311679 | A1* | 10/2016 | Maier ................. B81C 1/00269 |

FOREIGN PATENT DOCUMENTS

| DE | 10 2013 106 353 | 12/2014 |
| DE | 10 2014 204 666 | 9/2015 |
| DE | 10 2015 106 442 | 11/2016 |

* cited by examiner

*Primary Examiner* — Kyoung Lee
(74) *Attorney, Agent, or Firm* — Dicke, Billig & Czaja, PLLC

(57) ABSTRACT

A method for fabricating an electronic device is disclosed. In one example, the method comprises providing a semiconductor wafer, forming a plurality of cavities into the semiconductor wafer, filling a stabilization material into the cavities, fabricating a temporary panel by applying a cap sheet onto the semiconductor wafer, the cap sheet covering the cavities, singulating the temporary panel into a plurality of semiconductor devices, fabricating an embedded wafer by embedding the semiconductor devices in an encapsulant, removing the cap sheet of each one of the semiconductor devices, and singulating the embedded wafer into a plurality of electronic devices.

20 Claims, 5 Drawing Sheets

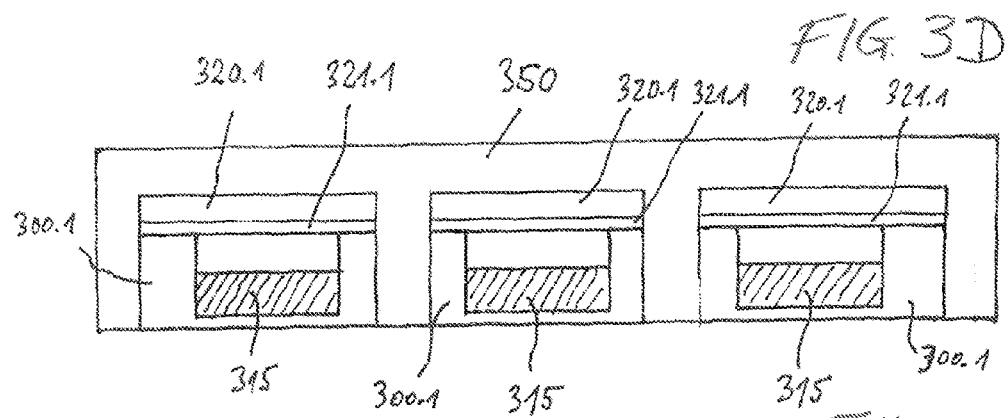
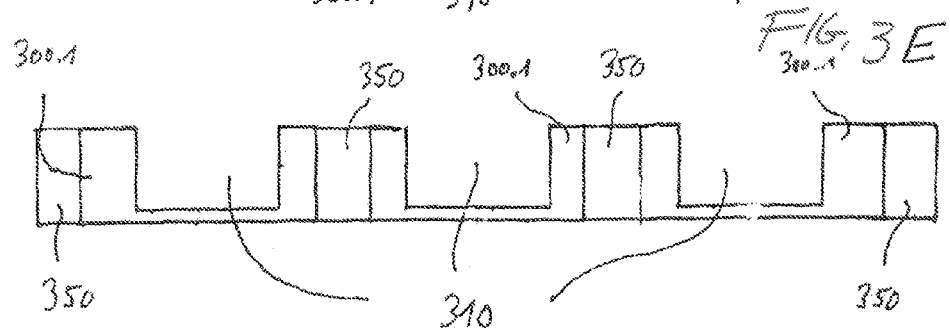
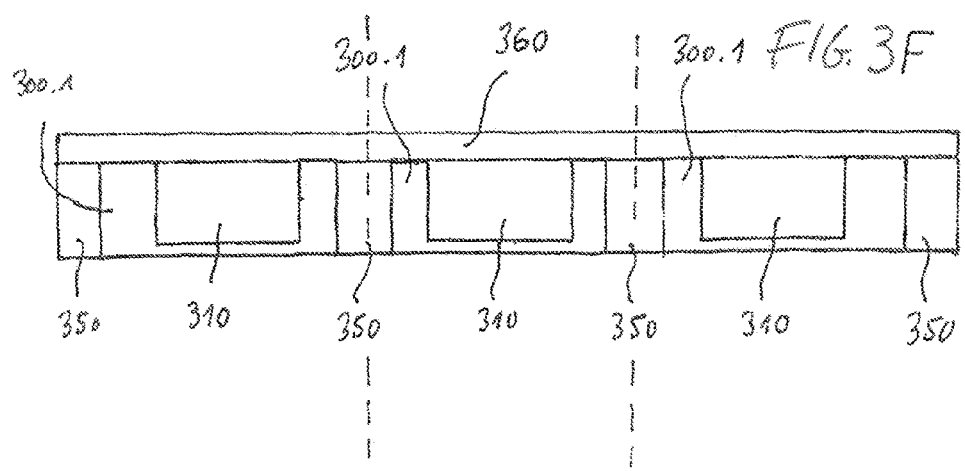

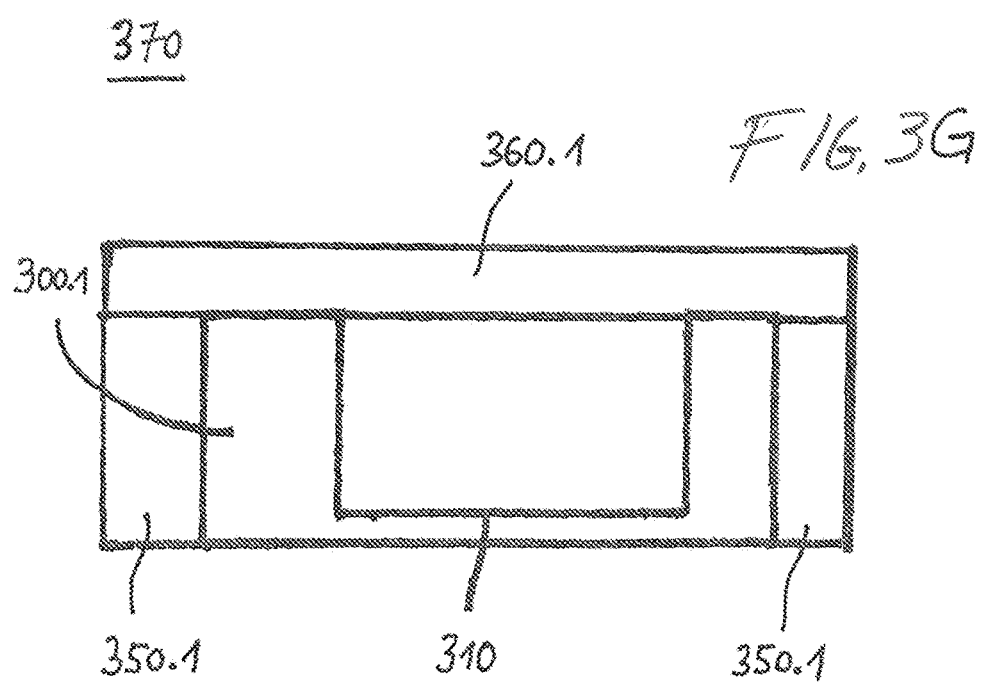

TEMPORARY MECHANICAL STABILIZATION OF SEMICONDUCTOR CAVITIES

CROSS-REFERENCE TO RELATED APPLICATION

This Utility Patent Application claims priority to German Patent Application No. 10 2016 117 990.6, filed Sep. 23, 2016, which is incorporated herein by reference.

BACKGROUND

The present disclosure relates to a method for fabricating an electronic device. Microphones, pressure and gas sensors are implemented in electronic devices such as, for example, smartphones, tablet computers, laptop computers, automotive and medical devices. Such devices may nowadays be constructed as silicon micro-electro-mechanical systems (MEMS). In a microphone, for example, a back volume is formed below or behind a MEMS sound device. The term "back volume" may refer to a space opposite to a MEMS sound component like, for example, a membrane on which sound waves may impinge and may also be referred to as a backside cavity. The back volume is limited on one side by the MEMS membrane and on the other side by a cap or lid which covers the microphone cavity.

MEMS devices, as described before, can, for example, be fabricated on a wafer level basis starting with a semiconductor wafer as, for example, a silicon wafer. After forming cavities into the semiconductor wafer by, for example, etching, problems might occur due to a low mechanical stability of the semiconductor wafer, in particular if the cavities are etched down to thin MEMS structures which have been previously fabricated on a main face of the semiconductor wafer. Such problems with the mechanical stability may turn out to be obstructive for the further processing of the semiconductor wafer.

SUMMARY

In accordance with a first aspect of the disclosure, a method for fabricating an electronic device comprises providing a semiconductor wafer, forming a plurality of cavities into the semiconductor wafer, filling a stabilization material into the cavities, fabricating a temporary panel by applying a cap sheet onto the semiconductor wafer, the cap sheet covering the cavities, singulating the temporary panel into a plurality of semiconductor devices, fabricating an embedded wafer by embedding the semiconductor devices in an encapsulant, removing the cap sheet of each one of the semiconductor devices, and singulating the embedded wafer into a plurality of electronic devices.

In accordance with a second aspect of the disclosure, a method for fabricating an electronic device comprises providing a semiconductor wafer comprising a plurality of cavities, filling a stabilization material into the cavities, singulating the semiconductor wafer into a plurality of semiconductor devices, fabricating an embedded wafer by embedding the semiconductor devices in an encapsulant, removing the stabilization material out of the cavities, and singulating the embedded wafer into a plurality of electronic devices.

The person skilled in the art recognizes additional features and advantages upon reading the following detailed description and upon giving consideration to the accompanying drawings.

BRIEF DESCRIPTION OF THE DRAWINGS

The accompanying drawings are included to provide a further understanding of examples and are incorporated in and constitute a part of this specification. The drawings illustrate examples and together with the description serve to explain principles of examples. Other examples and many of the intended advantages of examples will be readily appreciated as they become better understood by reference to the following detailed description.

DETAILED DESCRIPTION

Figure 1:
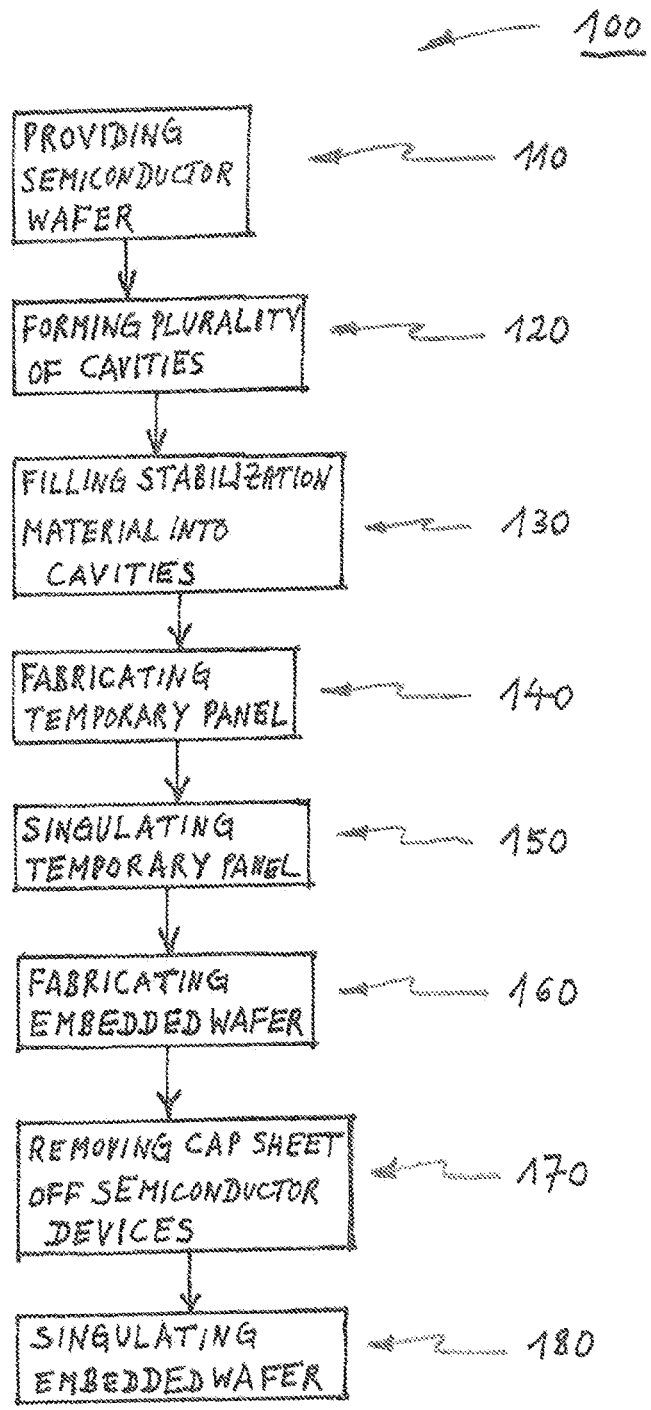
FIG. 1 shows a flow diagram for illustrating an exemplary method for fabricating an electronic device according to a first aspect.

The aspects and examples are now described with reference to the drawings, wherein like reference numerals are generally utilized to refer to like elements throughout. In the following description, for purposes of explanation, numerous specific details are set forth in order to provide a thorough understanding of one or more aspects of the examples. It may be evident, however, to one skilled in the art that one or more aspects of the examples may be practiced with a lesser degree of the specific details. In other instances, known structures and elements are shown in schematic form in order to facilitate describing one or more aspects of the examples. It is to be understood that other examples may be utilized and structural or logical changes may be made without departing from the scope of the present disclosure. It should be noted further that the drawings are not to scale or not necessarily to scale. Also in the drawings the thicknesses of lines, layers and/or regions may be exaggerated for clarity.

In the following detailed description, reference is made to the accompanying drawings, which form a part hereof, and in which is shown by way of illustration specific aspects in which the disclosure may be practiced. In this regard, directional terminology, such as "top", "bottom", "front", "back" etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present disclosure. The following detailed description, therefore, is not to be taken in a limiting sense, and the scope of the present disclosure is defined by the appended claims.

In addition, while a particular feature or aspect of an example may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled"

and "connected", along with derivatives may be used. It should be understood that these terms may be used to indicate that two elements co-operate or interact with each other regardless whether they are in direct physical or electrical contact, or they are not in direct contact with each other. Other word used to describe the relationship between elements should be interpreted in a like fashion (e.g., "between" versus "directly between", "adjacent" versus "directly adjacent" etc.). Also, the term "exemplary" is merely meant as an example, rather than the best or optimal. The following detailed description, therefore, is not to be taken in a limiting sense, and the scope of the present disclosure is defined by the appended claims.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises", "comprising", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

The examples of a method for fabricating an electronic device comprise in a particular stadium the embedding of semiconductor devices in an encapsulant. The encapsulant can be any electrically insulating material like, for example, any kind of molding material, any kind of resin material, or any kind of epoxy material, a bismaleimide, or a cyanate ester. The encapsulant can also be a polymer material, a polyimide material, or a thermoplast material. The encapsulant may also comprise any of the above-mentioned materials and further include filler materials embedded therein like, for example, thermally conductive increments. These filler increments can be made of SiO, SiC, Al2O3, ZnO, AlN, BN, MgO, Si3N4, or ceramic, or a metallic material like, for example, Cu, Al, Ag, or Mo. Furthermore the filler increments may have the shape of fibers and can be made of carbon fibers or nanotubes, for example. The encapsulant may also include further additives for adjusting manufacturing properties.

Insofar as a method for fabricating an electronic device is described as having a specific order of method steps, it should be mentioned that any other appropriate order of the method steps may be employed by the skilled person.

FIG. 1 shows a flow diagram for illustrating an exemplary method for fabricating an electronic device according to the first aspect. The method 100 of FIG. 1 comprises providing a semiconductor wafer (110), forming a plurality of cavities into the semiconductor wafer (120), filling a stabilization material into the cavities (130), fabricating a temporary panel by applying a cap-sheet onto the semiconductor wafer, the cap-sheet covering the cavities (140), singulating the temporary panel into a plurality of semiconductor devices (150), fabricating an embedded wafer by embedding the semiconductor devices in an encapsulant (160), removing the cap-sheet of each one of the semiconductor devices (170), and singulating the embedded wafer into a plurality of electronic devices (180).

According to an example of the method 100 of the first aspect, after removing the cap-sheet the stabilization material will also be removed out of the cavities. According to a further example thereof, the stabilization material will be removed by rinsing out the cavities by means of a liquid, in particular by means of acetone or toluene.

According to an example of the method 100 of the first aspect, selecting the kind of stabilization material is performed in dependence on the expected process temperatures of the subsequent steps of the method.

According to an example of the method 100 of the first aspect, the stabilization material is chosen such that it comprises a melting temperature $T_s$ in a range from 40° C. to 160° C., more specifically in a range from 45° C. to 150° C.

According to an example of the method 100 of the first aspect, the stabilization material is chosen such that it is configured to change its physical state from amorphous to viscoelastic or vice versa at a temperature $T_a$ wherein the temperature is in a range from 40° C. to 160° C., more specifically in a range from 50° C. to 150° C.

According to an example of the method 100 of the first aspect, the stabilization material is chosen such that it can washed out or rinsed out by other solvents than acetone or toluene, in particular with solvents which are less aggressive than acetone or toluene.

According to an example of the method 100 of the first aspect, the stabilization material comprises one or more of a thermoplast material, a polymer, a wax like, for example, Apiezon wax, a polyethylene, a polybutadiene, a trans-1,4-polybutadiene, a polypropylene, an amorphous polymer, and an ataxic polystyrene.

According to an example of the method 100 of the first aspect, the stabilization material is filled into the cavities so that in each cavity 20% to 80% of the volume of the cavity is occupied by the stabilization material. According to a further example thereof, the stabilization material is filled into the cavities so that in each cavity 30% to 70%, more specifically 40% to 60%, more specifically 45% to 55%, more specifically around 50%, of the volume of the cavity is occupied by the stabilization material. In this way and by choosing one or more of the above-mentioned materials for the stabilization material it can be made sure that during the whole process the stabilization material does not exert any thermomechanical stress onto the semiconductor device.

According to a further example thereof, the respective remaining volume of the cavity is evacuated so that, in case of liquefaction of the stabilization material due to an increase of the process temperature above the melting temperature, the liquid stabilization material can freely flow into the remaining volume of the cavity.

According to an example of the method 100 of the first aspect, the semiconductor wafer comprises a first main face and a second main face opposite to the first main face, wherein prior to the forming of the cavities a plurality of MEMS structures is formed at the first main face and the cavities are formed in the second main face so that each cavity extends from the second main face until a distance above one of the MEMS structures. According to a further example thereof, each one of the MEMS structures may comprise a thin semiconductor membrane which is initially covered by an oxide, wherein forming of the cavity is performed by etching down to the oxide.

According to an example of the method 100 of the first aspect, forming the cavities comprises etching the semiconductor material of the semiconductor wafer.

According to an example of the method 100 of the first aspect, applying a cap sheet comprises applying a semiconductor sheet, in particular a further semiconductor wafer, onto the already processed semiconductor wafer.

According to an example of the method 100 of the first aspect, fabricating an embedded wafer comprises a wafer level packaging process. A specific example thereof will be described further below in connection with FIGS. 3A-3G.

Figure 2:
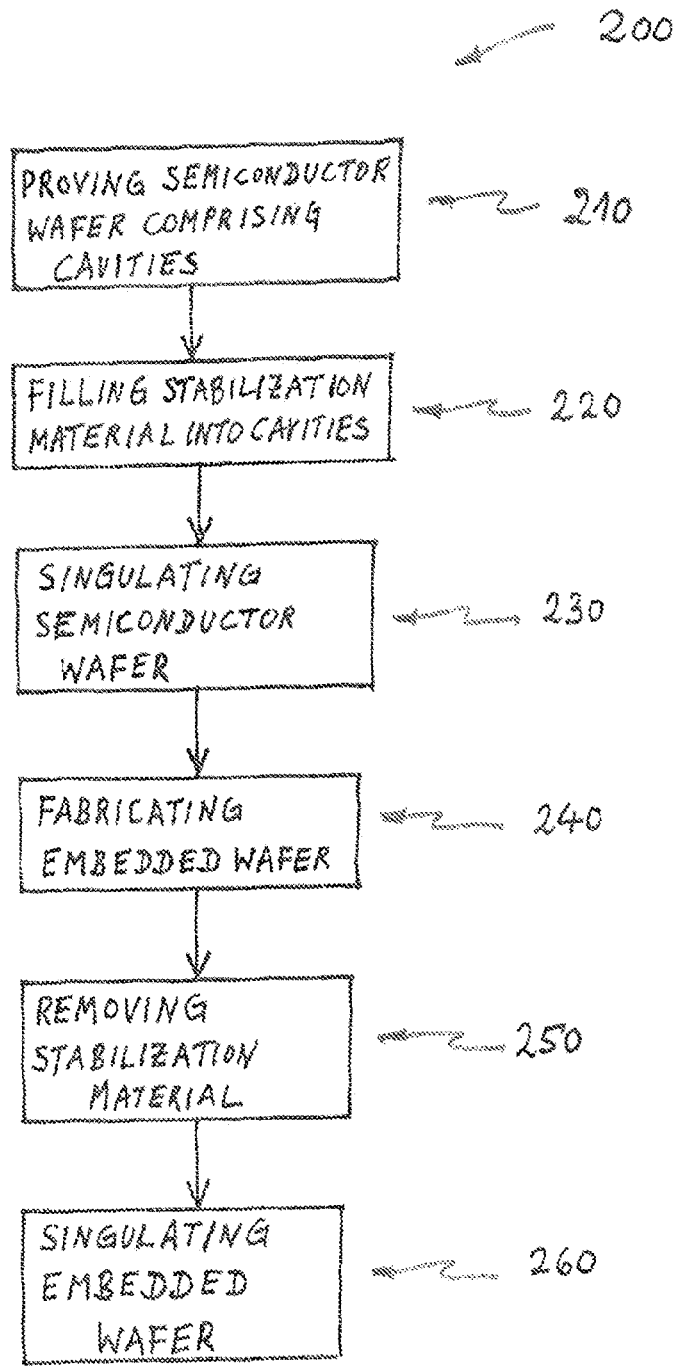
FIG. 2 shows a flow diagram for illustrating an exemplary method for fabricating an electronic device according to a second aspect.

FIG. 2 shows a flow diagram of an exemplary method for fabricating an electronic device according to the second aspect. The method 200 of the second aspect comprises providing a semiconductor wafer comprising a plurality of cavities (210), filling a stabilization material into the cavities (220), singulating the semiconductor wafer into a plurality of semiconductor devices (230), fabricating an embedded wafer by embedding the semiconductor devices in an encapsulant (240), removing the stabilization material out of the cavities (250), and singulating the embedded wafer into a plurality of electronic devices (260).

According to an example of the method 200 of the second aspect, selecting the kind of stabilization material is performed in dependence on the expected process temperatures of the subsequent steps of the method.

According to an example of the method 200 of the second aspect, after filling a stabilization material into the cavities, a temporary panel is fabricated by applying a cap-sheet onto the semiconductor wafer, the cap-sheet covering the cavities. Thereafter, the temporary panel is singulated into a plurality of semiconductor devices and, after embedding the semiconductor devices in an encapsulant, the cap-sheet is removed.

According to an example of the method 200 of the second aspect, removing the stabilization material comprises rinsing out the cavities by means of a liquid, in particular by means of acetone or toluene.

Further examples of the method 200 of the second aspect can be formed by combining it with features or aspects as described above in connection with the method 100 of the first aspect.

FIGS. 3A-3G show schematic cross-sectional side view representations for illustrating an exemplary method for fabricating an electronic device.

Figure 3A:
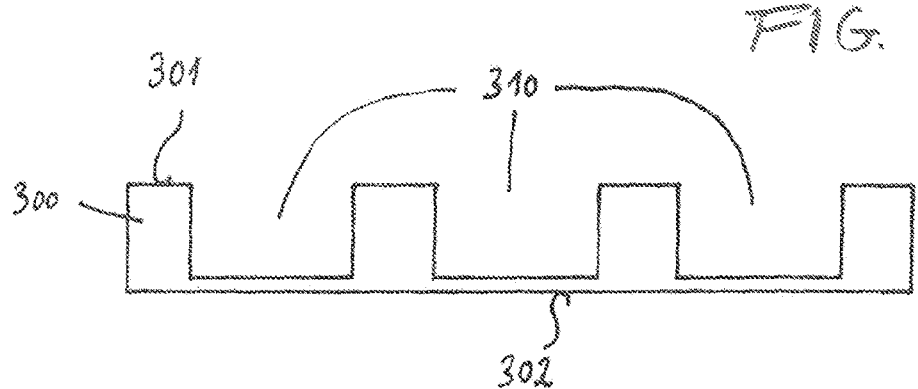
FIG. 3 comprises FIG. 3A to 3G and shows schematic cross-sectional side view representations for illustrating a method for fabricating an electronic device according to an example.

FIG. 3A shows a section of a semiconductor wafer 300, in particular a silicon wafer, the semiconductor wafer 300 comprising a plurality of cavities 310 formed from an upper, first main face 301 of the semiconductor wafer 300. The cavities 310 can, for example, be formed by etching. Prior to forming the cavities 310, MEMS devices (not shown) can be formed on or adjacent to a lower, second main face 302 of the semiconductor wafer 300 so that the MEMS devices are formed adjacent to the bottom of the cavities 310.

Figure 3B:
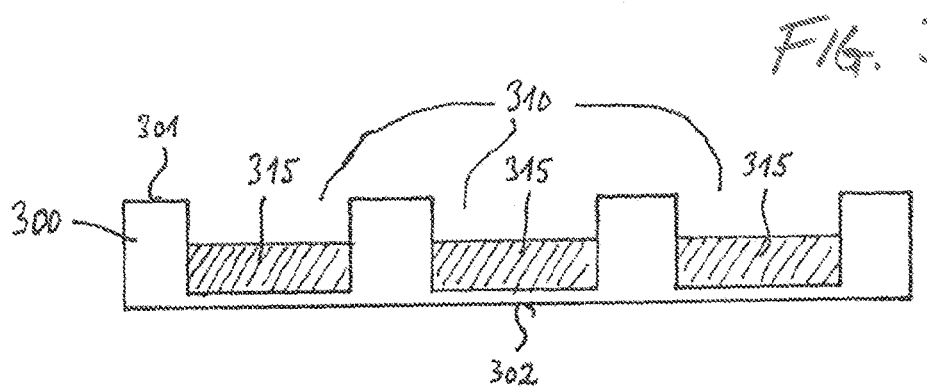

FIG. 3B shows the filling of the cavities 310 with a stabilization material 315. The stabilization material 315 can be filled into the cavities 310 in such a way that approximately half of the volume of the cavities 310 is occupied by the stabilization material 315. The stabilization 315 can be any kind of a polymer or another organic material or anyone of the materials as mentioned above.

Figure 3C:
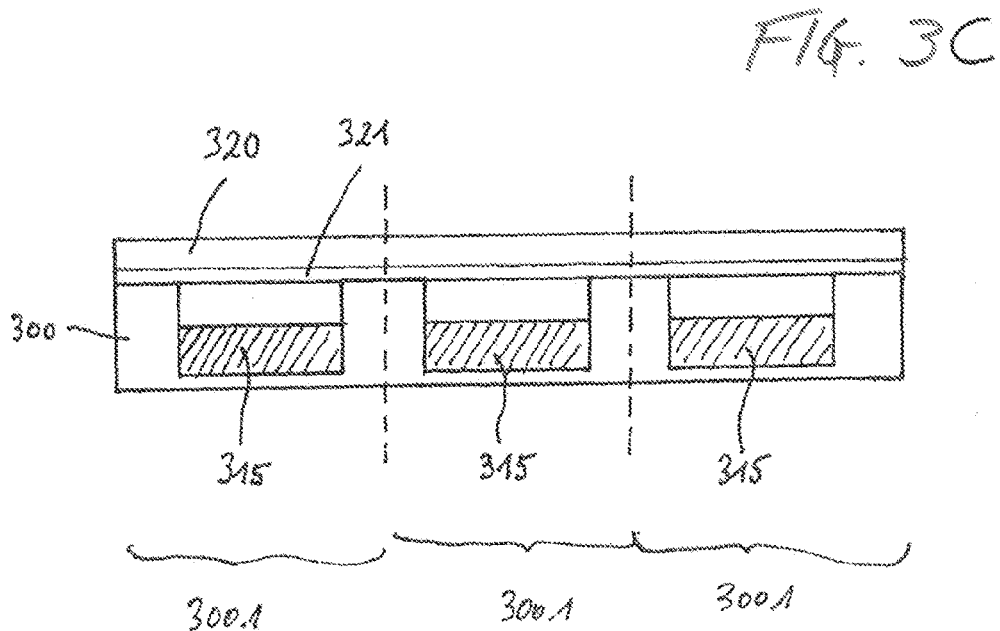

FIG. 3C shows the attaching of a cap-sheet 320 onto the semiconductor wafer 300 so that the cap-sheet 320 covers the cavities 310. The cap sheet 320 can be a semiconductor wafer, in particular a silicon wafer, and it can be attached to the semiconductor wafer 300 by an adhesive layer 321. In this way a temporary panel is produced consisting essentially of the processed semiconductor wafer 300 and the cap sheet 320. Thereafter, several process steps of the method may be carried out which will not be described here. After these process steps the temporary panel will be singulated into individual semiconductor devices 300.1 along the dashed lines.

FIG. 3D shows the fabricating of a reconfigured wafer by embedding the semiconductor devices 300.1 in an encapsulant 350. Each one of the semiconductor devices 300.1 comprises its own cap sheet portion 320.1 attached to the semiconductor body by a corresponding adhesive layer portion 321.1. Embedding of the semiconductor devices 300.1 in an encapsulant 350 can be carried out by embedded wafer level packaging which means that, for example, the semiconductor devices 300.1 are placed with an appropriate distance from each other on a temporary carrier. The semiconductor devices 300.1 are attached to the temporary carrier by means of an adhesive foil like a thermorelease foil. Then the encapsulant 350 is applied onto the semiconductor devices 300.1 so that it fills the intermediate spaces between the semiconductor devices 300.1 and covers their upper main faces. The material of the encapsulant 350 can be anyone of the materials mentioned above. After curing and hardening of the encapsulant 350 the temporary carrier is removed and an embedded reconfigured wafer is obtained as shown in FIG. 3D.

FIG. 3E shows the embedded reconfigured wafer after removing the upper layer of the encapsulant 350, the cap sheet portions 320.1 and the adhesive layer portions 321.1 on top of each one of the semiconductor devices 300.1. The step removing can be carried out by, for example, grinding our chemical-mechanical polishing (CMP). Thereafter, the stabilization material 315 is removed out of each one of the semiconductor devices 300.1 by, for example, rinsing out by means of a liquid solvent which can be, for example, acetone or toluene. However, was mentioned before in case of an appropriate stabilization material 350, also another liquid solvent can be employed which is less aggressive than acetone or toluene. After washing or rinsing out the stabilization material 350, again empty cavities 310 are obtained.

FIG. 3F shows the embedded reconfigured wafer after attaching or bonding a cap panel 360 on top of the cavities such that the cap panel 360 forms an upper wall for each one of the cavities 310. The cap panel 360 can be made of any appropriate material. For example, the cap panel can be fabricated out of any kind of mold compound, but also of semiconductor material like Si, of glass, of ceramic, or of metal. Attaching or bonding the cap panel onto the embedded reconfigured wafer can be performed by gluing or adhering or by soldering in case of metallic surfaces. The glue or adhesive can be applied onto one or both of the surfaces by printing, for example. After attaching the cap panel 360, the embedded reconfigured wafer will be singulated along the dashed lines.

FIG. 3G shows a finished electronic device 370 which comprises the semiconductor device 300.1 comprising a cavity 310, the semiconductor device 300.1 being embedded by encapsulant portions 350.1, and being covered by a cap portion 360.1. It should be mentioned that the electronic device 370 may also comprise electrical contact areas (not shown) for connecting the electronic device 370 to a printed circuit board (PCB). The electrical contact areas may be formed, for example, at a lower surface of the encapsulant portions 350.1 and which may be fabricated in a step during or after applying the encapsulant 350.

While the invention has been illustrated and described with respect to one or more implementations, alterations and/or modifications may be made to the illustrated examples without departing from the spirit and scope of the appended claims. In particular with regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. A method for fabricating an electronic device, the method comprising:
   providing a semiconductor wafer;
   forming a plurality of cavities into the semiconductor wafer;
   filling a stabilization material into the cavities;
   fabricating a temporary panel by applying a cap-sheet onto the semiconductor wafer, the cap sheet covering the cavities;
   singulating the temporary panel into a plurality of semiconductor devices;
   fabricating an embedded wafer by embedding the semiconductor devices in an encapsulant;
   removing the cap sheet of each one of the semiconductor devices; and
   singulating the embedded wafer into a plurality of electronic devices.

2. The method according to claim 1, further comprising:
   removing the stabilization material out of the cavities after removing the cap sheet.

3. The method according to claim 1, wherein
   the stabilization material comprises a melting temperature $T_s$ in a range from 40° C. to 160° C.

4. The method according to claim 1, wherein
   the stabilization material is configured to change its physical state from amorphous to viscoelastic or vice versa at a temperature $T_a$ wherein the temperature is in a range from 40° C. to 160° C.

5. The method according to claim 1, wherein
   the stabilization material comprises one or more of a thermoplast material, a polymer, a wax, a polyethylene, a polybutadiene, a trans-1,4-polybutadiene, a polypropylene, an amorphous polymer, and an ataxic polystyrene.

6. The method according to claim 1, wherein
   the stabilization material is filled into the cavities so that in each cavity 20% to 70% of the volume of the cavity is occupied by the stabilization material.

7. The method according to claim 6, wherein
   the remaining volume of the cavity is evacuated.

8. The method according to claim 1, wherein
   the semiconductor wafer comprises a first main face and a second main face opposite to the first main face, and wherein, prior to the forming of the cavities, a plurality of MEMS structures is formed at the first main face and the cavities are formed in the second main face so that each cavity extends from the second main face until a distance above one of the MEMS structures.

9. The method according to claim 1, wherein
   forming a plurality of cavities comprises etching the semiconductor material of the semiconductor wafer.

10. The method according to claim 1, wherein
    applying a cap sheet comprises applying a semiconductor sheet, in particular a further semiconductor wafer, onto the semiconductor wafer.

11. The method according to claim 1, wherein
    fabricating an embedded wafer comprises a wafer level packaging process.

12. The method according to claim 1, wherein
    removing the cap sheet comprises grinding.

13. A method for fabricating an electronic device, the method comprising:
    providing a semiconductor wafer comprising a plurality of cavities;
    filling a stabilization material into the cavities;
    singulating the semiconductor wafer into a plurality of semiconductor devices;
    fabricating an embedded wafer by embedding the semiconductor devices in an encapsulant;
    removing the stabilization material out of the cavities; and
    singulating the embedded wafer into a plurality of electronic devices.

14. The method according to claim 13, further comprising:
    selecting the kind of stabilization material in dependence on the process temperatures of the subsequent steps of the method.

15. The method according to claim 13, wherein
    the stabilization material comprises one or more of a thermoplast material, a polymer, a wax, a polyethylene, a polybutadiene, a trans-1,4-polybutadiene, a polypropylene, an amorphous polymer, and an ataxic polystyrene.

16. The method according to claim 13, wherein
    removing the stabilization material comprises rinsing out the cavities by means of a liquid, in particular by means of acetone or toluene.

17. A method for fabricating an electronic device, the method comprising:
    providing a semiconductor wafer;
    forming a plurality of cavities into the semiconductor wafer;
    filling a stabilization material into the cavities;
    fabricating a temporary panel by applying a cap-sheet onto the semiconductor wafer, the cap sheet covering the cavities;
    singulating the temporary panel into a plurality of semiconductor devices;
    fabricating an embedded wafer by embedding the semiconductor devices in an encapsulant;
    removing the cap sheet of each one of the semiconductor devices;
    singulating the embedded wafer into a plurality of electronic devices; and
    removing the stabilization material out of the cavities after removing the cap sheet, wherein the stabilization material is configured to change its physical state from amorphous to viscoelastic or vice versa at a temperature $T_a$ wherein the temperature is in a range from 40° C. to 160° C.

18. The method according to claim 17, wherein
    the stabilization material comprises one or more of a thermoplast material, a polymer, a wax, a polyethylene, a polybutadiene, a trans-1,4-polybutadiene, a polypropylene, an amorphous polymer, and an ataxic polystyrene.

19. The method according to claim 17, wherein the stabilization material is filled into the cavities so that in each cavity 20% to 70% of the volume of the cavity is occupied by the stabilization material.

20. The method according to claim 19, wherein the remaining volume of the cavity is evacuated.

\* \* \* \* \*